(12) United States Patent
Shin et al.

(10) Patent No.: US 9,799,819 B2
(45) Date of Patent: Oct. 24, 2017

(54) ELASTIC WAVE DEVICE

(71) Applicant: Murata Manufacturing Co., Ltd., Nagaokakyo-shi, Kyoto-fu (JP)

(72) Inventors: Yasuaki Shin, Nagaokakyo (JP); Hiroyuki Nishi, Nagaokakyo (JP); Kazushi Watanabe, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 224 days.

(21) Appl. No.: 14/737,723

(22) Filed: Jun. 12, 2015

(65) Prior Publication Data

US 2015/0372659 A1    Dec. 24, 2015

(30) Foreign Application Priority Data

Jun. 20, 2014   (JP) ................................ 2014-127502

(51) Int. Cl.
| | |
|---|---|
| *H03H 9/25* | (2006.01) |
| *H01L 41/053* | (2006.01) |
| *H03H 3/10* | (2006.01) |
| *H03H 9/02* | (2006.01) |
| *H03H 9/05* | (2006.01) |

(52) U.S. Cl.
CPC ............ *H01L 41/053* (2013.01); *H03H 3/10* (2013.01); *H03H 9/02559* (2013.01); *H03H 9/058* (2013.01)

(58) Field of Classification Search
CPC ........... H03H 9/02535; H03H 9/02543; H03H 9/02559
See application file for complete search history.

(56) References Cited

U.S. PATENT DOCUMENTS

| | | | | | |
|---|---|---|---|---|---|
| 4,224,549 | A | * | 9/1980 | O'Connell | G10K 11/36 310/313 A |
| 6,037,847 | A | * | 3/2000 | Ueda | H03H 9/02559 310/313 A |
| 6,674,215 | B1 | * | 1/2004 | Yoshida | H03H 9/02559 310/313 B |
| 8,723,396 | B2 | * | 5/2014 | Yamanaka | H03H 9/02551 310/313 A |
| 2008/0018414 | A1 | * | 1/2008 | Inoue | H03H 3/08 333/133 |
| 2014/0332395 | A1 | * | 11/2014 | Tsuda | H03H 3/08 205/114 |
| 2016/0149557 | A1 | * | 5/2016 | Hira | H03H 9/64 333/133 |
| 2016/0261248 | A1 | * | 9/2016 | Grousset | H03H 9/02574 |
| 2017/0134003 | A1 | * | 5/2017 | Kawasaki | H03H 9/176 |

FOREIGN PATENT DOCUMENTS

| | | |
|---|---|---|
| JP | 2006-101550 A | 4/2006 |
| JP | 2012-205215 A | 10/2012 |

* cited by examiner

*Primary Examiner* — J. San Martin
(74) *Attorney, Agent, or Firm* — Keating & Bennett, LLP

(57) ABSTRACT

An elastic wave device is configured such that a first surface acoustic wave chip including a piezoelectric substrate is mounted on a package board, a center of the first surface acoustic wave chip is shifted from a center of the package board when viewed from above, and a crystal Z-axis orientation of the piezoelectric substrate of the first surface acoustic wave chip is slanted to extend toward an outer side portion from a central portion of the package board as it progresses toward an upper surface from a lower surface of the piezoelectric substrate.

16 Claims, 8 Drawing Sheets

ELASTIC WAVE DEVICE

BACKGROUND OF THE INVENTION

1. Field of the Invention

The present invention relates to elastic wave devices in which a surface acoustic wave chip including a piezoelectric substrate is mounted on a package board.

2. Description of the Related Art

Hitherto, various kinds of elastic wave devices in which a surface acoustic wave chip is mounted on a package board have been proposed. For example, in Japanese Unexamined Patent Application Publication No. 2006-101550, two surface acoustic wave chips having different frequency characteristics are mounted on a package board by flip chip bonding. Each surface acoustic wave chip includes a piezoelectric substrate that is cut out of a single crystal having X, Y, and Z crystal axes. A long side of the surface acoustic wave chip extends along a direction where the coefficient of linear expansion of the surface acoustic wave chip has a value close to the coefficient of linear expansion of the package. The two surface acoustic wave chips are disposed so that the long sides thereof oppose each other.

In Japanese Unexamined Patent Application Publication No. 2012-205215, a transmission filter chip and a reception filter chip configured of respective surface acoustic wave filter chips are mounted on a package board. A propagation direction of the surface acoustic wave of the transmission filter chip is the same as a propagation direction of the surface acoustic wave of the reception filter chip. A long side of the transmission filter chip and a long side of the reception filter chip are adjacent to each other.

As disclosed in Japanese Unexamined Patent Application Publication No. 2006-101550, Japanese Unexamined Patent Application Publication No. 2012-205215, and the like, surface acoustic wave chips have been mounted on a package board while considering the propagation directions of the respective surface acoustic waves of the chips. The temperature of an elastic wave device changes influenced by heat emitted from a power amplifier (PA) in use that is disposed in the vicinity of the device, or the like. An elastic wave device using an interdigital transducer (IDT) electrode that is provided in an anisotropic piezoelectric substrate such as $LiTaO_3$, $LiNbO_3$, or the like, has a problem that a change in frequency occurs in the piezoelectric substrate in proportion to a magnitude of thermal deformation.

SUMMARY OF THE INVENTION

Accordingly, preferred embodiments of the present invention provide an elastic wave device that is capable of significantly reducing or preventing thermal deformation when a temperature change is generated and has excellent temperature characteristics of frequency.

An elastic wave device according to a preferred embodiment of the present invention includes a first surface acoustic wave chip that includes a first piezoelectric substrate being made of a piezoelectric single crystal whose Y-axis rotation angle is neither about 0 degree nor an integer multiple of about 90 degrees and including an upper surface and a lower surface that oppose each other, and a first IDT electrode provided on the first piezoelectric substrate; a package board that opposes the lower surface of the first piezoelectric substrate and includes a chip mounting surface on which the first surface acoustic wave chip is mounted; and an attachment member configured to attach the first surface acoustic wave chip to the chip mounting surface. In the elastic wave device, a mounting position of the first surface acoustic wave chip is shifted toward an outer side portion from a central portion of the chip mounting surface when the chip mounting surface is viewed from above, and a crystal Z-axis orientation of the first piezoelectric substrate is slanted to extend toward the outer side portion from the central portion of the chip mounting surface as it progresses toward the upper surface from the lower surface of the first piezoelectric substrate.

In a specific aspect of the elastic wave device according to preferred embodiments of the present invention, a plurality of surface acoustic wave chips are mounted on the chip mounting surface of the package board, and at least one of the plurality of surface acoustic wave chips is the first surface acoustic wave chip.

In another specific aspect of the elastic wave device according to preferred embodiments of the present invention, all of the plurality of surface acoustic wave chips are the first surface acoustic wave chips.

In still another specific aspect of the elastic wave device according to preferred embodiments of the present invention, the chip mounting surface has a rectangular or substantially rectangular shape and the plurality of first surface acoustic wave chips are disposed along one side of the chip mounting surface.

In still another aspect of the elastic wave device according to preferred embodiments of the present invention, a plurality of surface acoustic wave chips are mounted on the chip mounting surface, and the plurality of surface acoustic wave chips include the first surface acoustic wave chip and a second surface acoustic wave chip; the second surface acoustic wave chip includes a second piezoelectric substrate being made of a piezoelectric single crystal whose Y-axis rotation angle is neither about 0 degree nor an integer multiple of about 90 degrees and having an upper surface and a lower surface that oppose each other, and a second IDT electrode provided on the second piezoelectric substrate; and a crystal Z-axis orientation of the second piezoelectric substrate is slanted to extend toward a central portion from an outer side portion of the chip mounting surface as it progresses toward the upper surface from the lower surface of the second piezoelectric substrate.

In still another specific aspect of the elastic wave device according to preferred embodiments of the present invention, propagation directions of respective surface acoustic waves of the plurality of surface acoustic wave chips are parallel or substantially parallel to each other when the chip mounting surface is viewed from above.

According to preferred embodiments of the present invention, thermal deformation of the piezoelectric substrate is significantly reduced or prevented even if a change in temperature occurs. This makes it possible to stabilize the temperature characteristics of frequency of the elastic wave device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, specific preferred embodiments of the present invention will be described with reference to the drawings so as to clarify the present invention.

The inventors of preferred embodiments of the present invention have researched and analyzed breakdown phenomena caused by thermal deformation upon a temperature change in the existing elastic wave device. As a result, the inventors discovered that there exist two crystal Z-axis orientations in a surface acoustic wave chip using an anisotropic piezoelectric substrate such as $LiTaO_3$, $LiNbO_3$, or the like and that the thermal deformation is capable of being alleviated by taking the above orientations into consideration, and therefore preferred embodiments of the present invention has been conceived.

First, the crystal Z-axis orientation will be described with reference to FIGS. 1 through 3.

Figure 1:
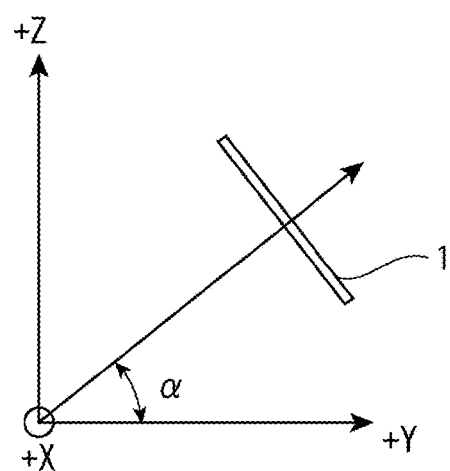
FIG. 1 is a schematic diagram illustrating a relationship among a crystal X-axis, a crystal Y-axis, a crystal Z-axis, and a cut-angle of a piezoelectric substrate.

FIG. 1 is a schematic diagram illustrating a relationship among an X-axis, a Y-axis and a Z-axis of a piezoelectric single crystal, and a cut-angle of a piezoelectric substrate. A piezoelectric substrate 1 shown in FIG. 1 is cut out of a piezoelectric single crystal having the X-axis, Y-axis, and Z-axis so as to have a Y-axis rotation angle of α, or a cut-angle of α. Here, the direction of the X-axis is a propagation direction of the surface acoustic wave. The direction of the X-axis is a direction from a front surface to a rear surface of the paper of FIG. 1.

In the piezoelectric substrate 1, in order to excite a surface acoustic wave, an IDT electrode is provided on a principal surface of the piezoelectric substrate 1. Accordingly, the propagation direction of the surface acoustic wave is a direction orthogonal to electrode fingers of the IDT electrode. As such, the propagation direction of the surface acoustic wave is also a direction parallel to the principal surface of the piezoelectric substrate 1.

Figure 2:
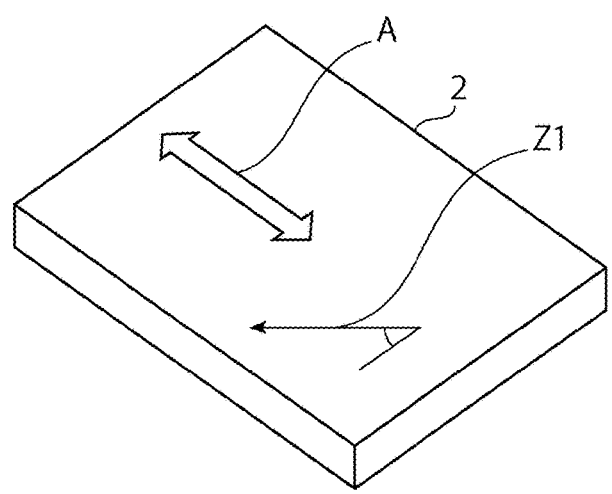
FIG. 2 is a schematic perspective view for explaining a propagation direction A of a surface acoustic wave and a crystal Z-axis orientation in a surface acoustic wave chip according to a first reference example.

FIG. 2 is a perspective view for explaining a propagation direction A of a surface acoustic wave and a crystal Z-axis orientation Z1 in a surface acoustic wave chip according to a first reference example. In a surface acoustic wave chip 2 of the first reference example, an IDT electrode is provided on a piezoelectric substrate illustrated in the drawing. Note that in FIGS. 2 and 3, the IDT electrode and the like are not illustrated. In the following descriptions, the propagation direction of the surface acoustic wave is indicated by an arrow mark A. The propagation direction A of the surface acoustic wave is a direction orthogonal to the electrode fingers of the IDT electrode.

Figure 3:
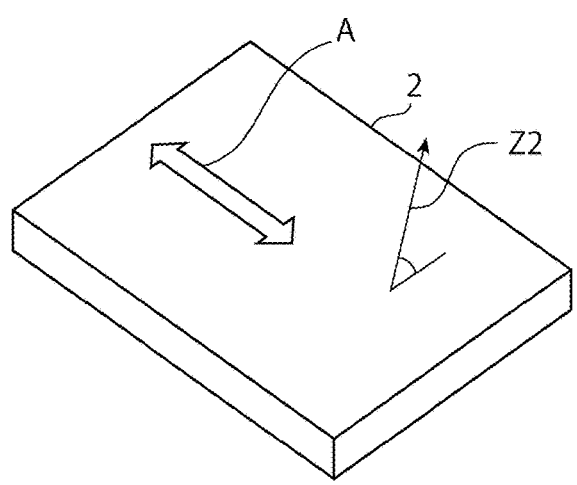
FIG. 3 is a schematic perspective view for explaining a propagation direction A of a surface acoustic wave and a crystal Z-axis orientation in a surface acoustic wave chip according to a second reference example.

Meanwhile, in the piezoelectric substrate made of the piezoelectric single crystal that is cut out so as to have the Y-axis rotation angle of α, or the cut-angle of α, there exist the orientation Z1 of the first reference example shown in FIG. 2 and an orientation Z2 of a second reference example shown in FIG. 3 in the orientation of the Z-axis direction. The crystal Z-axis orientation has a directional property. Accordingly, there is only one orientation for the crystal Z-axis in the case where the cut-angle of a is equal to about 0 degree or an integer multiple of about 90 degrees. However, there are two orientations for the crystal Z-axis in the case where the cut-angle of a is neither about 0 degree nor an integer multiple of about 90 degrees.

Meanwhile, a coefficient of linear expansion of $LiTaO_3$, $LiNbO_3$, or the like in the X-axis and Y-axis directions and a coefficient of linear expansion thereof on the Z-axis differ from each other. As such, in the case where a temperature change is generated in a structure in which a surface acoustic wave chip including a piezoelectric substrate is attached to a package board, an amount of displacement generated differs depending on the orientations of the above Z-axis. Hereinafter, preferred embodiments that are configured in consideration of the crystal Z-axis orientations Z1 and Z2 will be described along with comparative examples.

First Preferred Embodiment

Figure 4A:
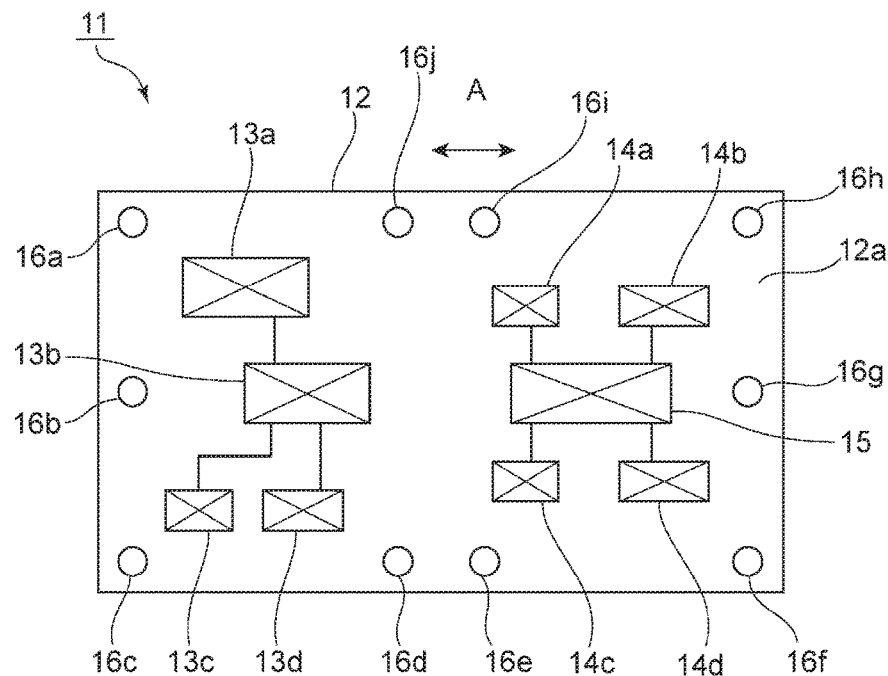
FIGS. 4A, 4B, and 4C are a schematic plan view illustrating a surface acoustic wave chip used in an elastic wave device, a general plan view illustrating an electrode structure of a surface acoustic wave resonator, and a general elevation view illustrating the elastic wave device, respectively, according to a preferred embodiment of the present invention.
Figure 4B:
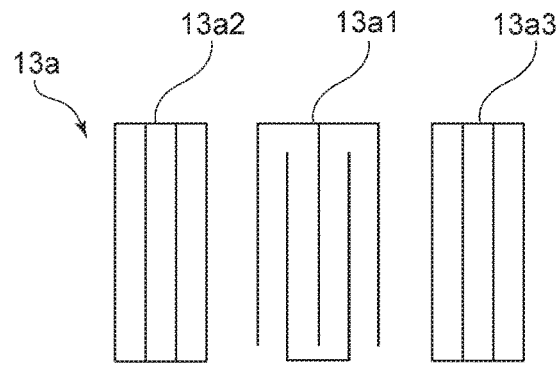

FIG. 4A is a schematic plan view of a first surface acoustic wave chip prepared in a first preferred embodiment of the present invention, and FIG. 4B is a general plan view illustrating an electrode structure of a surface acoustic wave resonator provided in the stated surface acoustic wave chip. A first surface acoustic wave chip 11 includes a piezoelectric substrate 12 as a first piezoelectric substrate. The piezoelectric substrate 12 is made of an anisotropic piezoelectric single crystal such as LiTaO$_3$, LiNbO$_3$, or the like. The piezoelectric substrate 12 is cut out of a piezoelectric single crystal so as to have a Y-axis rotation angle of α. Here, α is neither about 0 degree nor an integer multiple of about 90 degrees.

On a principal surface of the piezoelectric substrate 12, there are provided surface acoustic wave resonators 13a through 13d. The surface acoustic wave resonators 13a through 13d configure a first bandpass filter.

Meanwhile, on a side of a region where the first bandpass filter is configured, surface acoustic wave resonators 14a, 14b, 14c, and 14d, and a longitudinally coupled resonator-type surface acoustic wave filter 15 are configured, respectively. The longitudinally coupled resonator-type surface acoustic wave filter 15 and the surface acoustic wave resonators 14a through 14d configure a second bandpass filter.

Figure 4C:
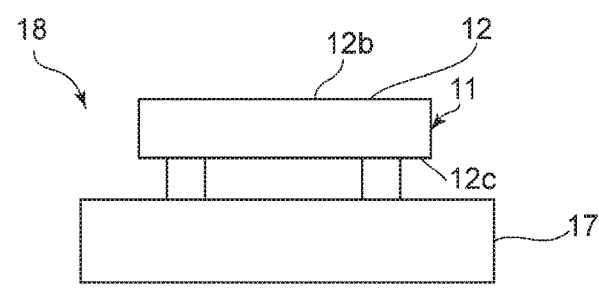

In FIGS. 4A through 4C, the electrode structures of the surface acoustic wave resonators and the longitudinally coupled resonator-type surface acoustic wave filter 15 are schematically illustrated. Specifically, as shown in FIG. 4B, for example, the surface acoustic wave resonator 13a includes an IDT electrode 13a1 as a first IDT electrode and reflectors 13a2, 13a3 disposed on both sides of the IDT electrode 13a1 in the propagation direction of the surface acoustic wave. In FIG. 4A, the propagation direction A of the surface acoustic wave is a direction in which the long sides of the piezoelectric substrate 12 extend.

The direction in which electrode fingers of the IDT electrode 13a1 shown in FIG. 4B extend is a direction orthogonal to the propagation direction A of the surface acoustic wave.

All of the surface acoustic wave resonators 13a through 13d and surface acoustic wave resonators 14a through 14d, and the longitudinally coupled resonator-type surface acoustic wave filter 15 have the same propagation direction of the surface acoustic wave.

In the first surface acoustic wave chip 11, bumps 16a through 16j are provided as attachment members in the perimeter of the piezoelectric substrate 12. As a material of the bump, Au, an Au alloy, solder, or the like can be used. The piezoelectric substrate 12 preferably has a rectangular or substantially rectangular shape, including a first side and a third side opposing each other, and a second side and a fourth side opposing each other and connected to the first and third sides. In the corners respectively defined by the first and second sides, the second and third sides, the third and fourth sides, and the fourth and first sides of the piezoelectric substrate 12, there are disposed the bump 16a, the bump 16c, the bump 16f, and the bump 16h in that order, respectively. The bumps 16i and 16j, the bump 16b, the bumps 16d and 16e, and the bump 16g are disposed in intermediate portions of the first, second, third, and fourth sides, respectively.

These bumps 16a through 16j are electrically connected to the surface acoustic wave resonators 13a through 13d, the surface acoustic wave resonators 14a through 14d, or the longitudinally coupled resonator-type surface acoustic wave filter 15 by wiring (not shown). Then, as shown in FIG. 4C, with a lower surface of the first surface acoustic wave chip 11 facing a chip mounting surface of a package board 17, the first surface acoustic wave chip 11 is attached, using the bumps 16a through 16j, to the chip mounting surface by flip chip bonding. With this, an elastic wave device 18 in which the surface acoustic wave chip 11 is attached to the package board 17 is obtained.

In the elastic wave device 18 of the first preferred embodiment, a crystal Z-axis orientation Z1 of the piezoelectric substrate 12 in the first surface acoustic wave chip 11 extends in a direction that is slanted while extending toward an outer side portion from a central portion of the piezoelectric substrate 12 as it progresses toward an upper surface from a lower surface of the piezoelectric substrate 12 that opposes the chip mounting surface. Here, a lower surface 12a of the piezoelectric substrate 12 opposes the package board 17. Note that a surface of the piezoelectric substrate 12 on the upper side is defined as "upper surface 12b" while a surface thereof on the lower side is defined as "lower surface 12a", based on an upper-lower direction in a state where the first surface acoustic wave chip 11 is mounted above the package board 17. As such, the lower surface 12a side of the piezoelectric substrate 12 opposing the chip mounting surface of the package board 17 is illustrated in FIG. 4A. Note that the IDT electrode can be provided on one of the upper and lower surfaces of the piezoelectric substrate 12 or on both the surfaces. It is preferable for the IDT electrode to be provided on the lower surface 12a of the piezoelectric substrate 12.

As discussed thus far, because the orientations of the crystal Z-axis of the piezoelectric substrate 12 take the above-described specific directions, a change in temperature characteristics of frequency (TCF) of the elastic wave device influenced by heat or the like which is generated due to operation of a power amplifier, excitation of the IDT, or the like, is significantly reduced or prevented in the manner as described below. Displacement of the piezoelectric substrate where the IDT electrode is provided generates a change in wave length due to a change in pitch between the electrode fingers of the IDT electrode, a change in electrostatic capacity due to a change in an opposing distance between a pair of comb-tooth type electrodes inserted into each other, and the like. This causes a change in frequency of the elastic wave device. As such, it is preferable to lessen the amount of displacement of the piezoelectric substrate because the change in temperature characteristics of frequency (TCF) is capable of being significantly reduced or prevented. In addition, it is preferable to lessen the amount of displacement generated in the corners of the piezoelectric substrate because the piezoelectric substrate is prevented from being damaged at bump attachment portions that are provided in the corners of the piezoelectric substrate which are likely to be damaged. This will be described below referring to FIGS. 5 through 8.

Figure 5:
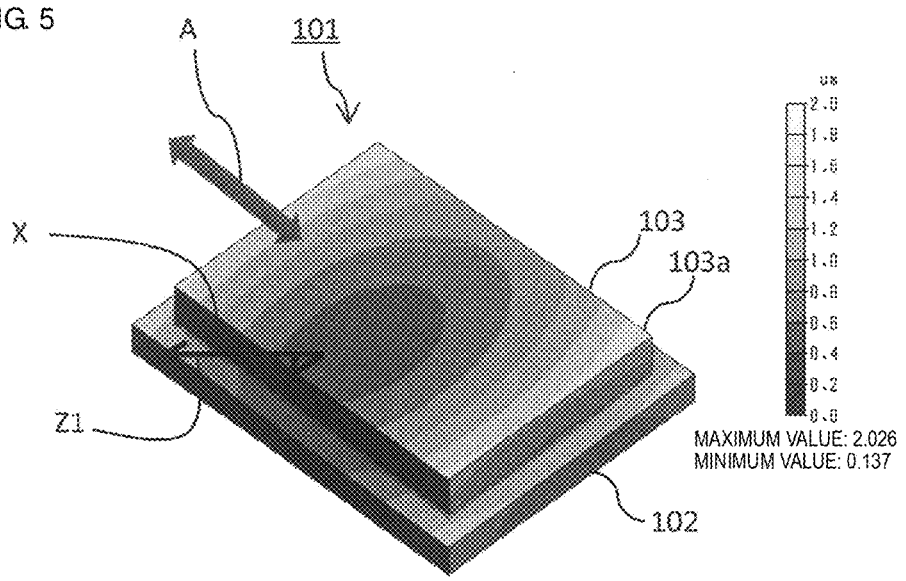
FIG. 5 is a diagram illustrating a relationship among the propagation direction A of the surface acoustic wave, the crystal Z-axis orientation, and distribution of amounts of displacement in an elastic wave device according to the first reference example.
Figure 6:
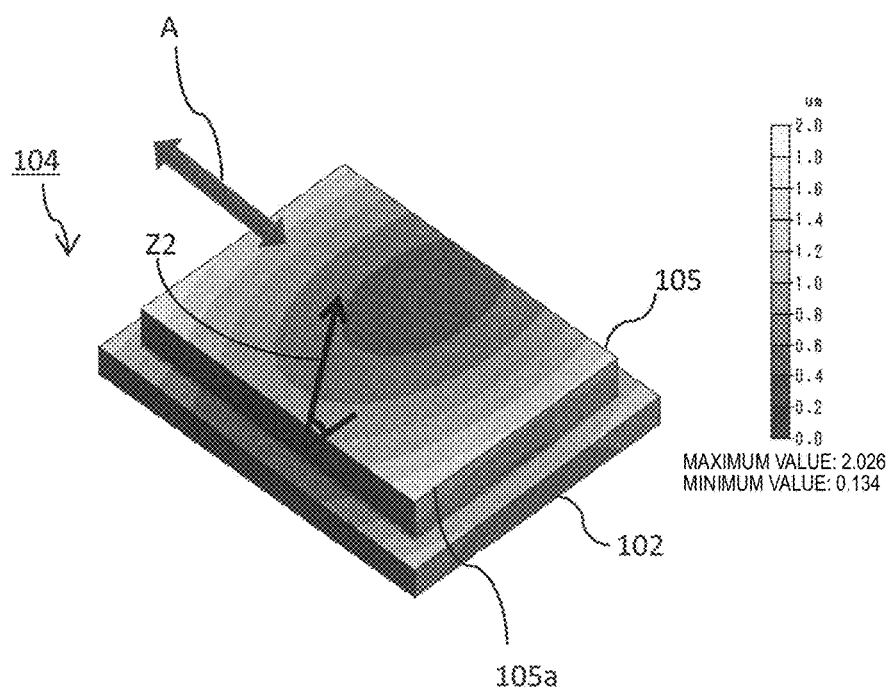
FIG. 6 is a diagram illustrating a relationship among the propagation direction A of the surface acoustic wave, the crystal Z-axis orientation, and distribution of amounts of displacement in an elastic wave device according to the second reference example.

FIGS. 5 and 6 are diagrams illustrating a relationship among a propagation direction of a surface acoustic wave, a crystal Z-axis orientation, and distribution of amounts of displacement in an elastic wave device of a first reference example, and a relationship among a propagation direction of a surface acoustic wave, a crystal Z-axis orientation, and distribution of amounts of displacement in an elastic wave device of a second reference example, respectively.

The distribution of amounts of displacement represents a result in which each amount of displacement (size of displacement in units of µm) is obtained by thermal stress analysis using a finite element method, where a temperature change of about +100° C. is caused to occur in an elastic wave device 101 based on a normal temperature of about 25° C.

In the elastic wave device 101 according to the first reference example, a surface acoustic wave chip 103 is mounted on a chip mounting surface of a rectangular or substantially rectangular package board 102. The center of the package board 102 matches the center of the surface acoustic wave chip 103 when the chip mounting surface is viewed from above. Note that the "center" here refers to the center in a plan view. In other words, the surface acoustic wave chip 103 is mounted to be positioned on a central portion of the package board 102 without being shifted toward an outer side portion of the board. The propagation direction A of the surface acoustic wave is in parallel to a lengthwise direction of the substantially rectangular surface acoustic wave chip 103. The crystal Z-axis orientation Z1 is slanted in a direction extending toward an outer side portion from the central portion of the chip mounting surface of the package board 102 as it progresses toward the upper surface from the lower surface of the piezoelectric substrate 12.

Meanwhile, in an elastic wave device 104 of the second reference example shown in FIG. 6, a surface acoustic wave chip 105 is mounted on the package board 102. In the surface acoustic wave chip 105, the crystal Z-axis orientation Z2 takes a direction different from the orientation Z1 in the first reference example. However, a difference in the amounts of displacement depending on the Z-axis orientations Z1 and Z2 can be hardly seen between the elastic wave device 101 and the elastic wave device 104. For example, the amount of displacement in the corner 103a is the same or substantially the same as the amount of displacement in the corner 105a. The reason for this may be as follows. That is, since the centers of the surface acoustic wave chips 103 and 105 respectively match the center of the package board 102, a difference in the amounts of displacement depending on the crystal Z-axis orientations Z1 and Z2 is not generated due to symmetry between the two.

Figure 7:
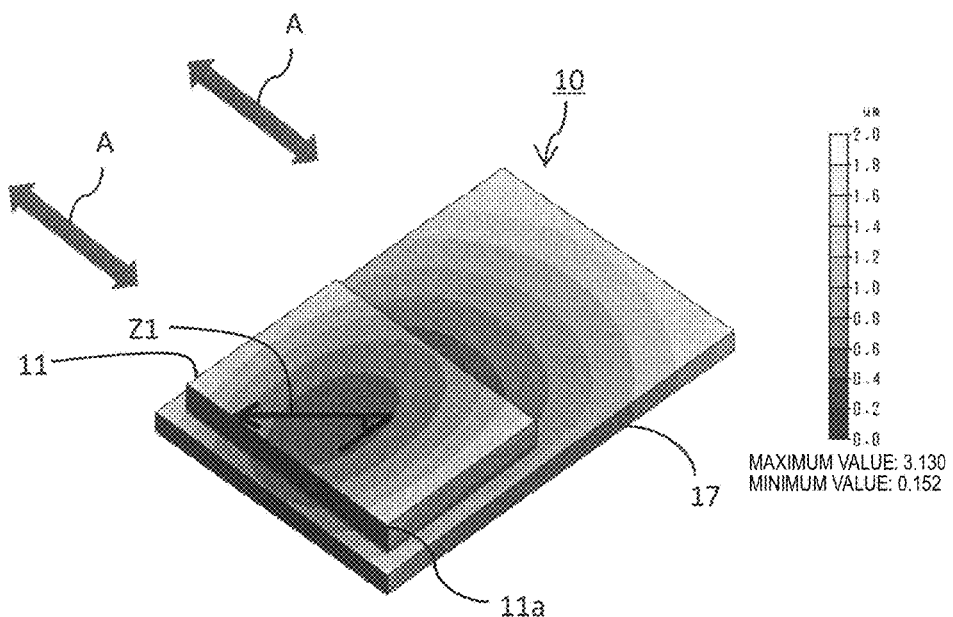
FIG. 7 is a diagram illustrating a relationship among a propagation direction A of a surface acoustic wave, a crystal Z-axis orientation, and distribution of amounts of displacement in an elastic wave device according to a first preferred embodiment of the present invention.

The distribution of amounts of displacement in each diagram shown in and after FIG. 7 is obtained in the same manner as described above. FIG. 7 is a diagram illustrating a relationship among the propagation direction A of the surface acoustic wave, the crystal Z-axis orientation Z1, and the distribution of amounts of displacement in an elastic wave device 10 of the first preferred embodiment. As shown in FIG. 7, in the elastic wave device 10, the center of the package board 17 and the center of the first surface acoustic wave chip 11 are shifted from each other when the chip mounting surface is viewed from above. More specifically, the first surface acoustic wave chip 11 is mounted on the substantially rectangular upper surface of the package board 17 at a position shifted toward one of the short sides thereof.

Figure 8:
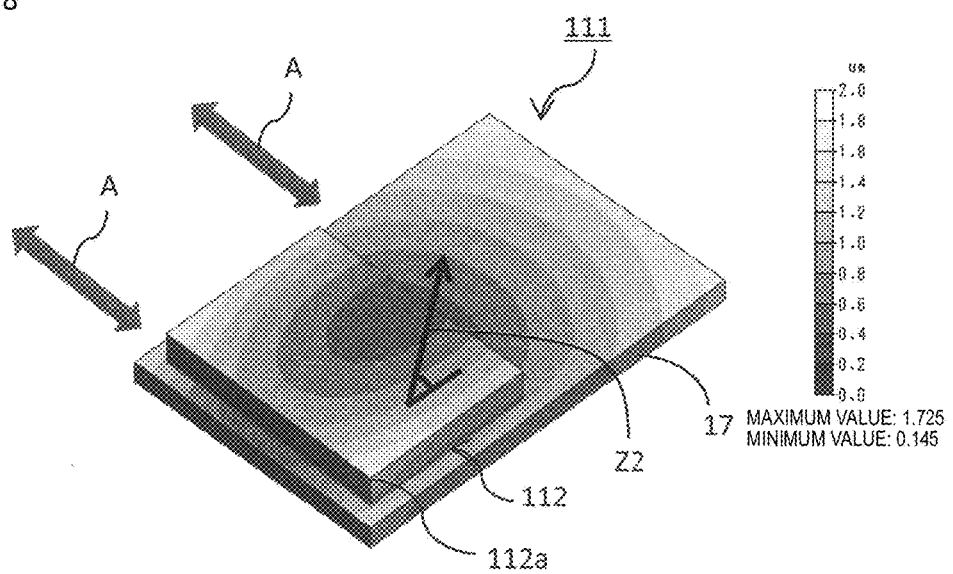
FIG. 8 is a diagram illustrating a relationship among a propagation direction A of a surface acoustic wave, a crystal Z-axis orientation, and distribution of amounts of displacement in an elastic wave device according to a first comparative example.

Meanwhile, FIG. 8 is a diagram illustrating a relationship among the propagation direction A of the surface acoustic wave, the crystal Z-axis orientation Z2, and the distribution of amounts of displacement in an elastic wave device 111 of a first comparative example.

In the elastic wave device 111 of the first comparative example, a surface acoustic wave chip 112 is mounted on the package board 17. The elastic wave device 111 is configured in the same manner as the elastic wave device 10 aside from that the crystal Z-axis orientation of the surface acoustic wave chip 112 takes the orientation Z2. In this case, the orientation Z2 is slanted so that the crystal Z-axis extends toward an outer side portion from the central portion of the chip mounting surface of the package board 17 as it progresses toward the upper surface from the lower surface of the piezoelectric substrate.

Here, the amounts of displacement of FIGS. 7 and 8 will be compared with each other. It can be understood that a region where the amount of displacement of the piezoelectric substrate is at a minimum of not less than about 0.4 μm and less than about 0.6 μm, for example, is widely spread in the central portion of the piezoelectric substrate in FIG. 7 in comparison with FIG. 8. In general, design in which the IDT electrode is provided in the central portion of the piezoelectric substrate is preferably used. If thermal deformation in the central portion of the piezoelectric substrate can be reduced, it is effective to stabilize the temperature characteristics of frequency of the elastic wave device. The corner 112a of the surface acoustic wave chip 112 shown in FIG. 8 is a region where the amount of displacement caused by thermal deformation preferably is not less than about 1.6 μm and less than about 1.8 μm, for example. On the contrary, the amount of displacement in the corner 11a of the surface acoustic wave chip 11 shown in FIG. 7 preferably is not less than about 1.4 μm and less than about 1.6 μm, for example, which is small in comparison with FIG. 8. Further, it can be understood that the maximum value of the amount of displacement in FIG. 7 is smaller than that in FIG. 8. This is because the crystal Z-axis orientation Z1 is slanted to extend toward an outer side portion from the central portion of the chip mounting surface of the package board 17 as it progresses toward the upper surface from the lower surface of the piezoelectric substrate in the elastic wave device 10, as shown in FIG. 7. The detailed configuration is as follows. That is, in the first surface acoustic wave chip 11 mounted on the package board 17, which has a substantially rectangular chip mounting surface, at a position shifted toward one short side of the package board 17, the crystal Z-axis orientation Z1 faces from the central portion toward the one short side of the package board 17 in parallel to a direction in which the long side of the package board 17 extends. Further, the orientation of the projected crystal Z-axis on the lower surface of the piezoelectric substrate is orthogonal to an elastic wave propagation orientation of the elastic wave excited by the IDT electrode.

As is clear from FIGS. 7 and 8, it can be understood that the amounts of displacement generated in the corners of the surface acoustic wave chips 11 and 112 differ depending on whether the orientation of the crystal Z-axis takes the orientation Z1 or Z2. In other words, like in the first preferred embodiment, in the case where the crystal Z-axis orientation is slanted to extend toward an outer side portion from the central portion of the piezoelectric substrate 12 as it progresses toward the upper surface from the lower surface of the piezoelectric substrate, the amount of displacement is effectively reduced or prevented.

As is discussed thus far, in the case where the center of the first surface acoustic wave chip 11 and the center of the package board 17 are shifted from each other when the chip mounting surface is viewed from above, the difference in the amounts of displacement is generated depending on the crystal z-axis orientations Z1 and Z2, which is clear from the result of the first comparative example. As opposed to this, in the configuration of the first preferred embodiment in which the first acoustic wave chip is disposed on the chip mounting surface at a position shifted toward an outer side portion from the central portion of the chip mounting surface, the crystal Z-axis orientation is slanted to extend toward an outer side portion from the central portion of the piezoelectric substrate as it progresses toward the upper surface from the lower surface of the piezoelectric substrate. As such, it can be understood that the amount of displacement in the corner of the piezoelectric substrate is significantly reduced or prevented because of the above-mentioned configuration.

Second Preferred Embodiment

Figure 9:
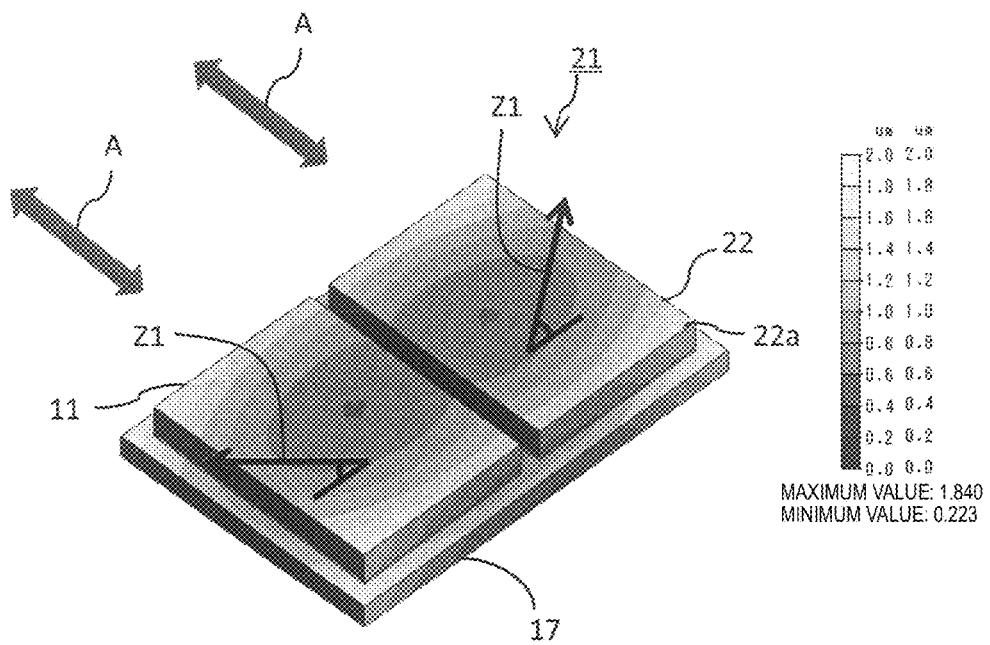
FIG. 9 is a diagram illustrating a relationship among a propagation direction A of a surface acoustic wave, a crystal Z-axis orientation, and distribution of amounts of displacement in an elastic wave device according to a second preferred embodiment of the present invention.

FIG. 9 is a diagram illustrating a relationship among the propagation direction A of the surface acoustic wave, the crystal Z-axis orientation Z1, and the distribution of amounts of displacement in an elastic wave device 21 according to a second preferred embodiment of the present invention.

In the elastic wave device 21 according to the second preferred embodiment, an additional first surface acoustic wave chip 22, aside from the first surface acoustic wave chip 11, is mounted on the package board 17. The elastic wave device 21 is configured in the same manner as the elastic wave device 10 except that the first surface acoustic wave chip 22 is mounted. The center of the first surface acoustic wave chip 22 is also shifted from the center of the package board 17.

Accordingly, also in the first surface acoustic wave chip 22, the amount of displacement differs depending on the crystal Z-axis orientation when a temperature change is generated. In the present preferred embodiment, also in the first surface acoustic wave chip 22, the orientation of the crystal Z-axis takes the orientation Z1. That is, the orientation is slanted to extend toward an outer side portion from the central portion of the package 17 as it progresses toward the upper surface from the lower surface of the piezoelectric substrate. Accordingly, also in the first surface acoustic wave chip 22, the amount of displacement caused by thermal deformation is significantly reduced or prevented in a corner 22a thereof. By making the amount of displacement smaller in the corner where a bump is attached, it is possible to prevent breakage of a bump attachment portion caused by a rapid temperature change during the reflow or the like.

It can be understood from FIG. 9 that a region where the amount of displacement of the first surface acoustic wave chip 11 as well as the additional first surface acoustic wave chip 22 is not less than about 0.4 μm and less than about 0.8 μm, for example, is widely spread in each of the central portions of the two piezoelectric substrates.

Third Preferred Embodiment

Figure 10:
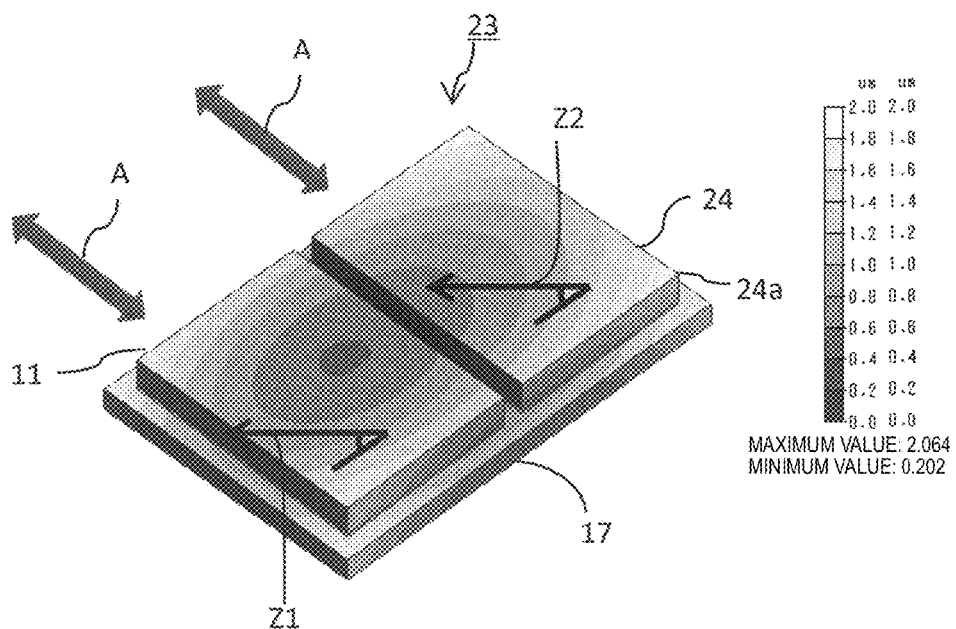
FIG. 10 is a diagram illustrating a relationship among a propagation direction A of a surface acoustic wave, a crystal Z-axis orientation, and distribution of amounts of displacement in an elastic wave device according to a third preferred embodiment of the present invention.

FIG. 10 is a diagram illustrating a relationship among the propagation direction A of the surface acoustic wave, the crystal Z-axis orientation, and the distribution of amounts of displacement in an elastic wave device 23 according to a third preferred embodiment of the present invention. In the elastic wave device 23 of the third preferred embodiment, the first surface acoustic wave chip 11 and a second surface acoustic wave chip 24 are mounted on the package board 17. The elastic wave device 23 is the same as the elastic wave device 10 except that the second surface acoustic wave chip 24 is mounted. Here, the orientation of the crystal Z-axis takes the orientation Z2 in the second surface acoustic wave chip 24. Other points of the elastic wave device 23 are the same as those of the elastic wave device 21.

In the elastic wave device 23, the orientation of the crystal Z-axis takes the orientation Z2 in the second surface acoustic wave chip 24. In other words, the crystal Z-axis orientation is slanted to extend toward the central portion from an outer side portion of the package board as it progresses toward the upper surface from the lower surface of the piezoelectric substrate.

As such, an amount of displacement that preferably is not less than about 1.8 μm and less than about 2.0 μm, for example, is generated in a corner 24a of the second surface acoustic wave chip 24. Accordingly, in the elastic wave device 23, a large amount of displacement is generated at the second surface acoustic wave chip 24 side due to a change in temperature. Note that, however, the amount of displacement is capable of being effectively reduced at the first surface acoustic wave chip 11 side. It can be understood from FIG. 10 that a region where the amount of displacement of the first surface acoustic wave chip 11 is not less than about 0.4 μm and less than about 0.8 μm, for example, is widely spread in the central portion of the piezoelectric substrate.

Therefore, although being inferior in mechanical strength to the elastic wave device 21 of the second preferred embodiment, it is possible, also in the elastic wave device 23 of the third preferred embodiment, to reduce the amount of displacement caused by thermal deformation in the surface acoustic wave chip 11 and enhance the mechanical strength of the device.

Fourth Preferred Embodiment

Figure 11:
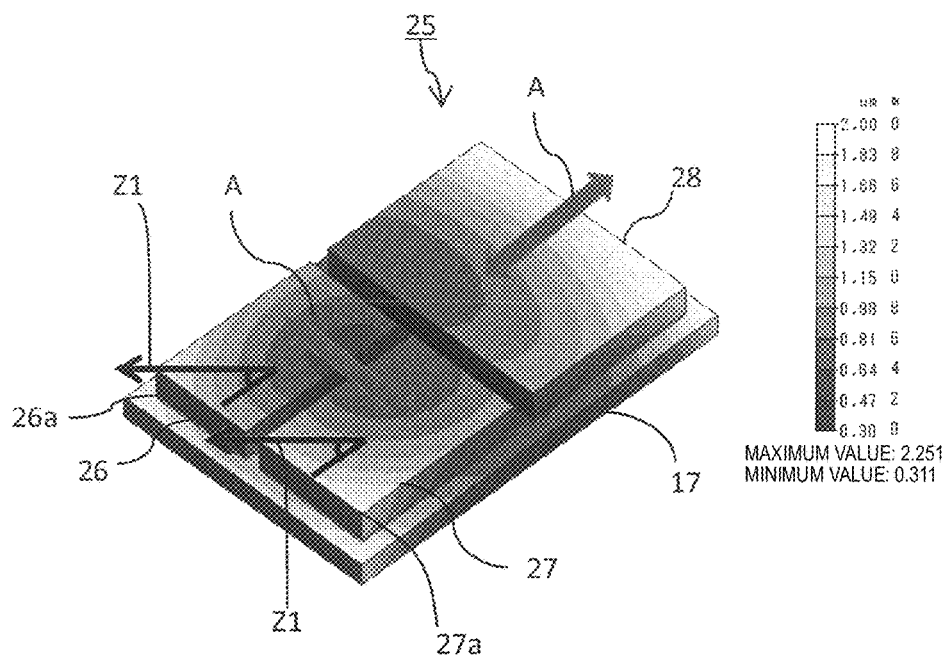
FIG. 11 is a diagram illustrating a relationship among a propagation direction A of a surface acoustic wave, a crystal Z-axis orientation, and distribution of amounts of displacement in an elastic wave device according to a fourth preferred embodiment of the present invention.
Figure 12:
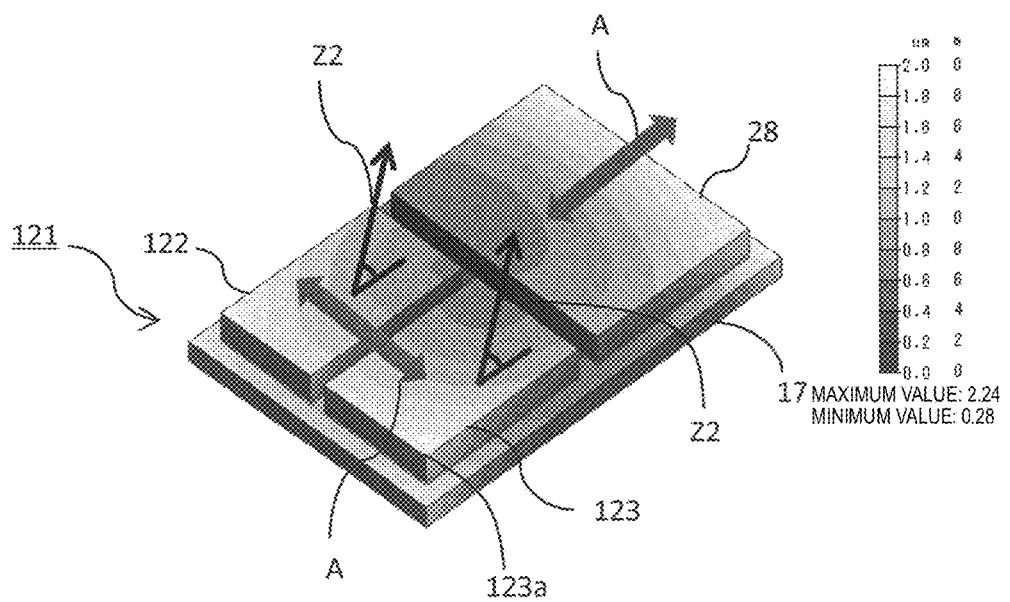
FIG. 12 is a diagram illustrating a relationship among a propagation direction A of a surface acoustic wave, a crystal Z-axis orientation, and distribution of amounts of displacement in an elastic wave device according to a second comparative example.

FIG. 11 is a diagram illustrating a relationship among the propagation direction A of the surface acoustic wave, the crystal Z-axis orientation Z1, and the distribution of amounts of displacement in an elastic wave device according to a fourth preferred embodiment of the present invention. FIG. 12 is a diagram illustrating a relationship among the propagation direction A of the surface acoustic wave, the crystal Z-axis orientation Z2, and the distribution of amounts of displacement in an elastic wave device according to a second comparative example.

In an elastic wave device 25 of the fourth preferred embodiment, two first surface acoustic wave chips 26, 27 and a second surface acoustic wave chip 28 are mounted on the package board 17. In other words, the first surface acoustic wave chips 26 and 27 are mounted on the package board 17 in a region at one of the short sides of the package board 17; while the second surface acoustic wave chip 28 is mounted in a region at the other of the short sides of the package board 17. In the case where the package board 17 is divided into two regions in the lengthwise direction, the first surface acoustic wave chips 26 and 27 are mounted in one of the two regions when the package board 17 is viewed from above. In the other of the two regions, the second surface acoustic wave chip 28 is mounted. Accordingly, the centers of the first and second surface acoustic wave chips 26 through 28 are shifted from the center of the package board 17.

The propagation direction A of the surface acoustic wave in the first surface acoustic wave chips 26 and 27 is a direction which is parallel to the short side of the package board 17. On the other hand, the propagation direction A of the surface acoustic wave in the second surface acoustic wave chip 28 is a direction which is parallel to the long side of the package board 17. As described above, the propagation direction of the surface acoustic wave in the second surface acoustic wave chip 28 may be different from the propagation direction of the surface acoustic wave in other chips, that is, the first surface acoustic wave chips 26 and 27.

In the present preferred embodiment, each crystal Z-axis of the first surface acoustic wave chips 26 and 27 takes the orientation Z1. In other words, the stated orientation is an orientation that extends toward the upper surface from the lower surface of the piezoelectric substrate and is slanted so as to extend toward an outer side portion from the central portion of the package board 17. As such, although the amount of displacement in corners 26a and 27a of the first surface acoustic wave chips 26 and 27 preferably is not less than about 1.8 μm and less than about 2.0 μm, a region where this large amount of displacement is observed is extremely small. On the other hand, a large amount of displacement is generated in the second surface acoustic wave chip 28 at a side thereof along the short side of the package board 17.

FIG. 12 is a diagram illustrating a relationship among the propagation direction A of the surface acoustic wave, the crystal Z-axis orientation Z2, and the distribution of amounts of displacement in an elastic wave device according to a second comparative example. In an elastic wave device 121 of the second comparative example, second surface acoustic wave chips 122 and 123 are mounted on the package board 17. In addition, the second surface acoustic wave chip 28 is also mounted thereon. The elastic wave device 121 is the same as the elastic wave device 25 except that the second surface acoustic wave chips 122 and 123 are mounted in place of the first surface acoustic wave chips 26 and 27.

The orientation of the crystal Z-axis is Z2 in the second surface acoustic wave chips 122 and 123, and other points of these chips are the same as those in the first surface acoustic wave chips 26 and 27.

In FIG. 11, a region where the amount of displacement preferably is not less than about 0.4 μm and less than about 1.2 μm, for example, is widely spread including the central portions of the two first surface acoustic wave chips 26, 27 and the second surface acoustic wave chip 28.

In FIG. 12, a region where the amount of displacement is not less than about 0.6 μm and less than about 1.6 μm, for example, is widely spread including the central portions of the two second surface acoustic wave chips 122, 123 and the second surface acoustic wave chip 28.

It can be observed that a region where the amount of displacement is not less than about 1.8 μm and less than about 2.0 μm, for example, is extremely larger in a corner 123a of FIG. 12 than in the corner 27a of FIG. 11. In other words, it can be observed, in the surface acoustic wave chip 123 with the crystal Z-axis orientation being Z2, that a region of large amounts of displacement is generated in a wide range in comparison with the first surface acoustic wave chip 27 shown in FIG. 11. Accordingly, also in the elastic wave device 25 of the fourth preferred embodiment in which the three surface acoustic wave chips 26, 27, and 28 are mounted on the package board 17, it can be understood that the amount of displacement is significantly reduced or prevented in the corner of the piezoelectric substrate, which is attached by the bump, when a temperature change is generated therein.

Fifth Preferred Embodiment and Third Comparative Example

Figure 13:
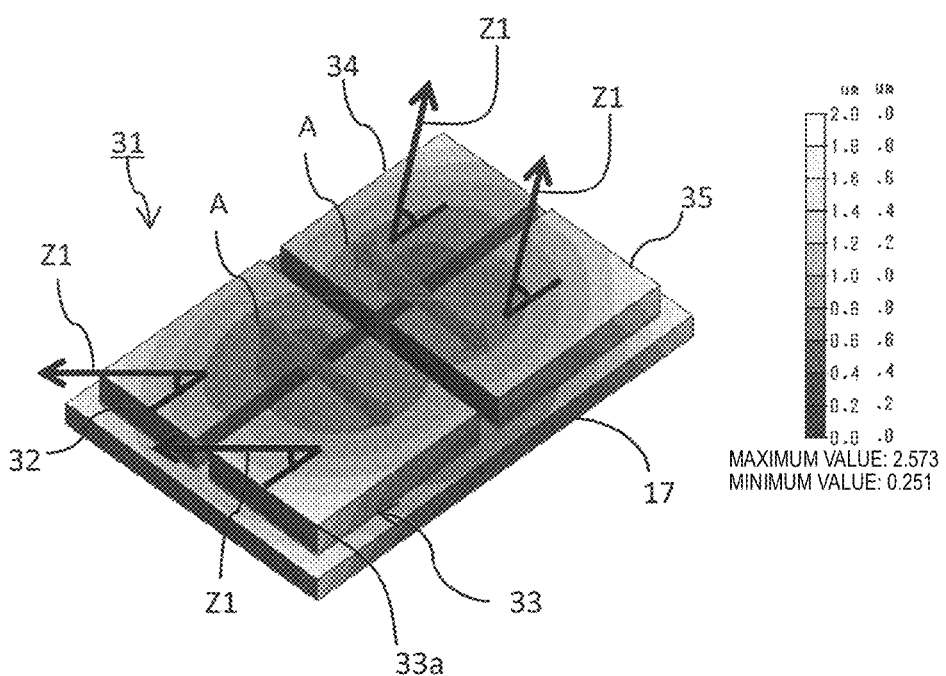
FIG. 13 is a diagram illustrating a relationship among a propagation direction A of a surface acoustic wave, a crystal Z-axis orientation, and distribution of amounts of displacement in an elastic wave device according to a fifth preferred embodiment of the present invention.
Figure 14:
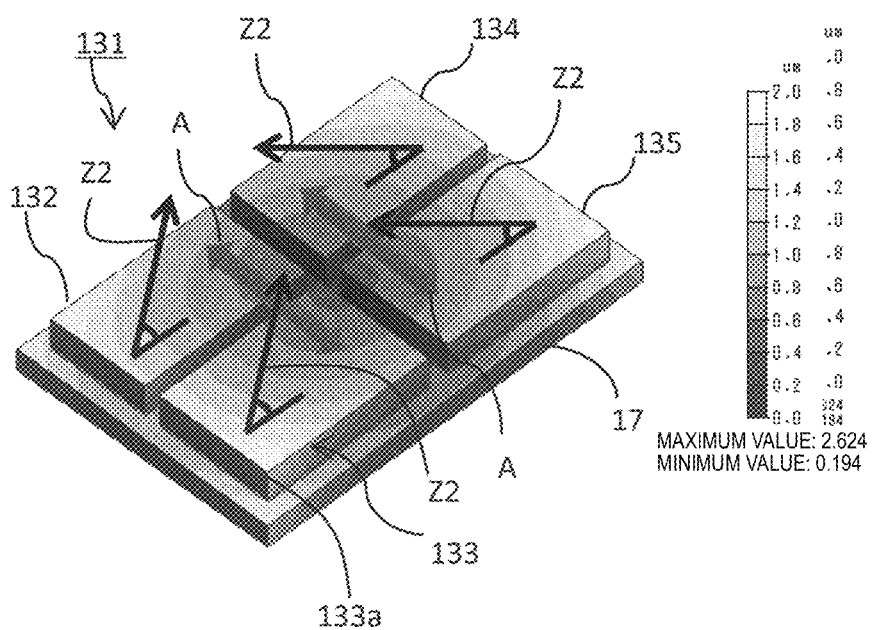
FIG. 14 is a diagram illustrating a relationship among a propagation direction A of a surface acoustic wave, a crystal Z-axis orientation, and distribution of amounts of displacement in an elastic wave device according to a third comparative example.

FIG. 13 is a diagram illustrating a relationship among the propagation direction A of the surface acoustic wave, the crystal Z-axis orientation Z1, and the distribution of amounts of displacement in an elastic wave device 31 according to a fifth preferred embodiment of the present invention. FIG. 14 is a diagram illustrating a relationship among the propagation direction A of the surface acoustic wave, the crystal Z-axis orientations Z1 and Z2, and the distribution of amounts of displacement in an elastic wave device 131 according to a third comparative example.

In the elastic wave device 31, first surface acoustic wave chips 32 through 35 are mounted on the package board 17. In other words, the first surface acoustic wave chips 32 and 33 are mounted on the rectangular or substantially rectangular package board 17 in a region at one of the short sides of the package board 17; while the first surface acoustic wave chips 34 and 35 are mounted in a region at the other of the short sides of the package board 17. In the present preferred embodiment, the propagation direction A of the surface acoustic wave in the first surface acoustic wave chips 32 through 35 is parallel to a direction along which the short side of the package board 17 extends. All the crystal Z-axis orientations in the first surface acoustic wave chips 32 through 35 take the direction of the orientation Z1. Accordingly, the amount of displacement in each corner of the first surface acoustic wave chips 32 through 35 is effectively reduced. For example, in a case of a corner 33a of the first surface acoustic wave chip 33, a region where the amount of displacement is large to be not less than about 1.8 μm and less than about 2.0 μm is extremely small in the corner.

In the elastic wave device 131 of the third comparative example, second surface acoustic wave chips 132 through 135 are mounted on the package board 17. The second surface acoustic wave chips 132 through 135 are all configured in the same manner as the first surface acoustic wave chips 32 through 35 except that each crystal Z-axis orientation takes the orientation Z2.

In the elastic wave device 131 of the third comparative example, the orientation of each crystal Z-axis of the second surface acoustic wave chips 132 through 135 takes the orientation Z2. Accordingly, in comparison with the elastic wave device 31 according to the fifth preferred embodiment, the amount of displacement in the central portion of each of the second surface acoustic wave chips 132 through 135 is large, and a region of large amounts of displacement is wide in each of the corners of the second surface acoustic wave chips 132 through 135. For example, in a case of a corner 133a of the second surface acoustic wave chip 133, it can be observed that a region where the amount of displacement is large to be not less than about 1.8 μm and less than about 2.0 μm, for example, is significantly wider in the corner 133a than that in the corner 33a shown in FIG. 13.

As such, it can be understood that, according to the elastic wave device 31 of the fifth preferred embodiment, the mechanical strength is effectively enhanced in comparison with the elastic wave device 131 of the third comparative example.

It is to be noted that in preferred embodiments of the present invention, the number of surface acoustic wave chips mounted on the package board can be arbitrarily defined. It is sufficient that at least one surface acoustic wave chip is disposed on the package board with the center of the piezoelectric substrate being shifted from the center of the package board and the crystal Z-axis orientation in the above surface acoustic wave chip is Z2.

Further, the electrode structure provided in each of the respective surface acoustic wave chips is not limited to any specific one, and is not limited to the electrode structure in the aforementioned first preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a first surface acoustic wave chip including a first piezoelectric substrate made of a piezoelectric single crystal whose Y-axis rotation angle is neither 0 degree nor an integer multiple of 90 degrees and including an upper surface and a lower surface that oppose each other, and a first IDT electrode provided on the first piezoelectric substrate;
a package board that opposes the lower surface of the first piezoelectric substrate and includes a chip mounting surface on which the first surface acoustic wave chip is mounted; and
an attachment member configured to attach the first surface acoustic wave chip to the chip mounting surface; wherein
a mounting position of the first surface acoustic wave chip is shifted toward an outer side portion from a central portion of the chip mounting surface when the chip mounting surface is viewed from above; and
a crystal Z-axis orientation of the first piezoelectric substrate is slanted to extend toward the outer side portion from the central portion of the chip mounting surface as it progresses toward the upper surface from the lower surface of the first piezoelectric substrate.

2. The elastic wave device according to claim 1, wherein a plurality of surface acoustic wave chips are mounted on the chip mounting surface of the package board, and at least one of the plurality of surface acoustic wave chips is the first surface acoustic wave chip.

3. The elastic wave device according to claim 2, wherein all of the plurality of surface acoustic wave chips are the first surface acoustic wave chips.

4. The elastic wave device according to claim 1, wherein the chip mounting surface has a rectangular or substantially rectangular shape; and
the plurality of first surface acoustic wave chips are disposed along one side of the chip mounting surface.

5. The elastic wave device according to claim 1, wherein a plurality of surface acoustic wave chips are mounted on the chip mounting surface, and the plurality of surface acoustic wave chips include the first surface acoustic wave chip and a second surface acoustic wave chip;
the second surface acoustic wave chip includes a second piezoelectric substrate made of a piezoelectric single crystal whose Y-axis rotation angle is neither 0 degree nor an integer multiple of 90 degrees and having an upper surface and a lower surface that oppose each other, and a second IDT electrode provided on the second piezoelectric substrate; and
a crystal Z-axis orientation of the second piezoelectric substrate is slanted to extend toward the central portion from an outer side portion of the chip mounting surface as it progresses toward the upper surface from the lower surface of the second piezoelectric substrate.

6. The elastic wave device according to claim 2, wherein propagation directions of respective surface acoustic waves of the plurality of surface acoustic wave chips are parallel to each other when the chip mounting surface is viewed from above.

7. The elastic wave device according to claim 1, wherein the first surface acoustic wave chip includes a first plurality of surface acoustic wave resonators on the first piezoelectric substrate that configure a first bandpass filter.

8. The elastic wave device according to claim 7, wherein the first surface acoustic wave chip includes a plurality of second surface acoustic wave resonators and a longitudinally coupled resonator-type surface acoustic wave filter on the first piezoelectric substrate that define a second bandpass filter.

9. The elastic wave device according to claim 1, further comprising an additional one of the first surface acoustic wave chip mounted on the chip mounting surface of the package board.

10. The elastic wave device according to claim 9, wherein the additional one of the first surface acoustic wave chip has a same structure as the first surface acoustic wave chip.

11. The elastic wave device according to claim 9, wherein a mounting position of the additional one of the first surface acoustic wave chip is shifted toward the outer side portion from the central portion of the chip mounting surface when the chip mounting surface is viewed from above.

12. The elastic wave device according to claim 9, wherein the additional one of the first surface acoustic wave chip includes a second piezoelectric substrate made of a piezoelectric single crystal whose Y-axis rotation angle is neither 0 degree nor an integer multiple of 90 degrees and including an upper surface and a lower surface that oppose each other, and a second IDT electrode provided on the second piezoelectric substrate; wherein a crystal Z-axis orientation of the second piezoelectric substrate is slanted to extend toward the outer side portion from the central portion of the chip mounting surface as it progresses toward the upper surface from the lower surface of the second piezoelectric substrate.

13. The elastic wave device according to claim 9, wherein the additional one of the first surface acoustic wave chip includes a second piezoelectric substrate made of a piezoelectric single crystal whose Y-axis rotation angle is neither 0 degree nor an integer multiple of 90 degrees and including an upper surface and a lower surface that oppose each other, and a second IDT electrode provided on the second piezoelectric substrate; wherein a crystal Z-axis orientation of the second piezoelectric substrate is slanted to extend from the outer side portion toward the central portion of the chip mounting surface as it progresses toward the upper surface from the lower surface of the second piezoelectric substrate.

14. The elastic wave device according to claim 9, further comprising a second surface acoustic wave chip mounted on the package board such that a propagation direction of the second surface acoustic wave chip is different from a propagation direction of the first surface acoustic wave chip and the additional one of the first surface acoustic wave chip.

15. The elastic wave device according to claim 3, wherein a propagation direction of a first group of the plurality of the first surface acoustic wave chips on one side on the chip mounting surface of the package board is parallel to a propagation direction of a second group of the plurality of the first surface acoustic wave chips mounted on another side of the chip mounting surface of the package board.

16. The elastic wave device according to claim 15, wherein the first group of the plurality of the first surface acoustic wave chips each includes the first piezoelectric substrate made of a piezoelectric single crystal whose Y-axis rotation angle is neither 0 degree nor an integer multiple of 90 degrees and including an upper surface and a lower surface that oppose each other, and a first IDT electrode provided on the first piezoelectric substrate, wherein a crystal Z-axis orientation of the first piezoelectric substrate is slanted to extend toward the outer side portion from the central portion of the chip mounting surface as it progresses toward the upper surface from the lower surface of the first piezoelectric substrate, and the second group of the plurality of the first surface acoustic wave chips each includes a second piezoelectric substrate made of a piezoelectric single crystal whose Y-axis rotation angle is neither 0 degree nor an integer multiple of 90 degrees and including an upper surface and a lower surface that oppose each other, and a second IDT electrode provided on the second piezoelectric substrate, wherein a crystal Z-axis orientation of the second piezoelectric substrate is slanted to extend from the outer side portion toward the central portion of the chip mounting surface as it progresses toward the upper surface from the lower surface of the second piezoelectric substrate.

* * * * *